United States Patent
Ikeda et al.

(10) Patent No.: US 11,721,276 B2
(45) Date of Patent: Aug. 8, 2023

(54) DISPLAY DEVICE

(71) Applicant: Japan Display Inc., Tokyo (JP)

(72) Inventors: Masanobu Ikeda, Tokyo (JP); Yoshinori Aoki, Tokyo (JP); Akihiro Ogawa, Tokyo (JP); Yasuhiro Kanaya, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 35 days.

(21) Appl. No.: 17/471,202

(22) Filed: Sep. 10, 2021

(65) Prior Publication Data

US 2021/0407385 A1 Dec. 30, 2021

Related U.S. Application Data

(63) Continuation of application No. PCT/JP2019/050422, filed on Dec. 23, 2019.

(30) Foreign Application Priority Data

Mar. 14, 2019 (JP) ................. 2019-047597

(51) Int. Cl.
*G09G 3/32* (2016.01)
*H01L 23/34* (2006.01)
*H01L 27/15* (2006.01)

(52) U.S. Cl.
CPC ............. *G09G 3/32* (2013.01); *H01L 23/34* (2013.01); *H01L 27/156* (2013.01); *G09G 2300/0426* (2013.01); *G09G 2300/0452* (2013.01); *G09G 2300/0819* (2013.01); *G09G 2320/041* (2013.01)

(58) Field of Classification Search
CPC ............. G09G 3/32; G09G 2300/0852; G09G 2300/0452; G09G 2300/0426; G09G 2320/041; G09G 2300/0819; G09F 9/33; G09F 9/30; H01L 27/156; H01L 25/167; H01L 23/34; H01L 25/0753
See application file for complete search history.

(56) References Cited

U.S. PATENT DOCUMENTS

| 6,911,624 B2 * | 6/2005 | Koopmans .............. H01L 24/81 219/209 |
| 9,728,125 B2 * | 8/2017 | Li ........................ G09G 3/3233 |
| 10,515,580 B2 | 12/2019 | Henry et al. |

(Continued)

FOREIGN PATENT DOCUMENTS

| CN | 1552052 A | * 12/2004 | ........... G09G 3/2003 |
| CN | 105094478 A | * 11/2015 | ............. G06F 3/041 |

(Continued)

OTHER PUBLICATIONS

International Search Report and Written Opinion dated Dec. 23, 2019, received for PCT Application PCT/JP2019/050422, Filed on Mar. 24, 2020, 8 pages including English Translation.

*Primary Examiner* — Vinh T Lam
(74) *Attorney, Agent, or Firm* — Xsensus LLP

(57) ABSTRACT

A display device includes a substrate, a plurality of pixels provided on the substrate, a light emitting element provided to each of the plurality of pixels, a first electrode provided to the substrate and electrically coupled to the light emitting element, a pixel circuit provided to the substrate and configured to drive the light emitting element, and a heat generation resistor provided to the pixel circuit.

11 Claims, 13 Drawing Sheets

(56) References Cited

U.S. PATENT DOCUMENTS

| | | | |
|---|---|---|---|
| 10,984,705 B2 | 4/2021 | Henry et al. | |
| 2015/0204494 A1* | 7/2015 | Wada | H01L 25/0753 |
| | | | 313/498 |
| 2017/0053974 A1* | 2/2017 | Koyama | H10K 59/131 |
| 2017/0179352 A1* | 6/2017 | Song | H01L 33/62 |

FOREIGN PATENT DOCUMENTS

| | | | | |
|---|---|---|---|---|
| CN | 107452345 A | * | 12/2017 | ............... G01K 1/14 |
| CN | 108649026 A | * | 10/2018 | |
| CN | 109360525 A | * | 2/2019 | |
| CN | 110136622 A | * | 8/2019 | ............... G09G 3/20 |
| JP | 2002-307734 A | | 10/2002 | |
| JP | 2005-309731 A | | 11/2004 | |
| JP | 2007-81094 A | | 3/2007 | |
| JP | 2007081094 | * | 3/2007 | ............... G09F 9/30 |
| JP | 2012231083 A | * | 11/2012 | ........... G02B 6/0021 |
| JP | 2015215780 A | * | 12/2015 | ............. G06F 3/041 |
| JP | 2017-529557 A | | 10/2017 | |
| JP | 2019061929 A | * | 4/2019 | ....... G02F 1/133603 |

\* cited by examiner

DISPLAY DEVICE

CROSS-REFERENCE TO RELATED APPLICATIONS

This application is a continuation of International Patent Application No. PCT/JP2019/050422 filed on Dec. 23, 2019, which designates the United States, incorporated herein by reference, and which claims the benefit of priority from Japanese Patent Application No. 2019-047597 filed on Mar. 14, 2019, incorporated herein by reference.

BACKGROUND

1. Technical Field

The present disclosure relates to a display device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are coupled to an array substrate (or a driver backplane in JP-T-2017-529557). The array substrate includes pixel circuits (or electronic control circuits in JP-T-2017-529557) that drive the LEDs.

The luminous efficiency of LEDs decreases with a rise in temperature. In display devices provided with LEDs, luminance may possibly decrease with a rise in temperature, thereby deteriorating display characteristics.

SUMMARY

A display device according to an embodiment of the present disclosure includes a substrate, a plurality of pixels provided on the substrate, a light emitting element provided to each of the plurality of pixels, a first electrode provided to the substrate and electrically coupled to the light emitting element, a pixel circuit provided to the substrate and configured to drive the light emitting element, and a heat generation resistor provided to the pixel circuit.

DETAILED DESCRIPTION

Figure 1:
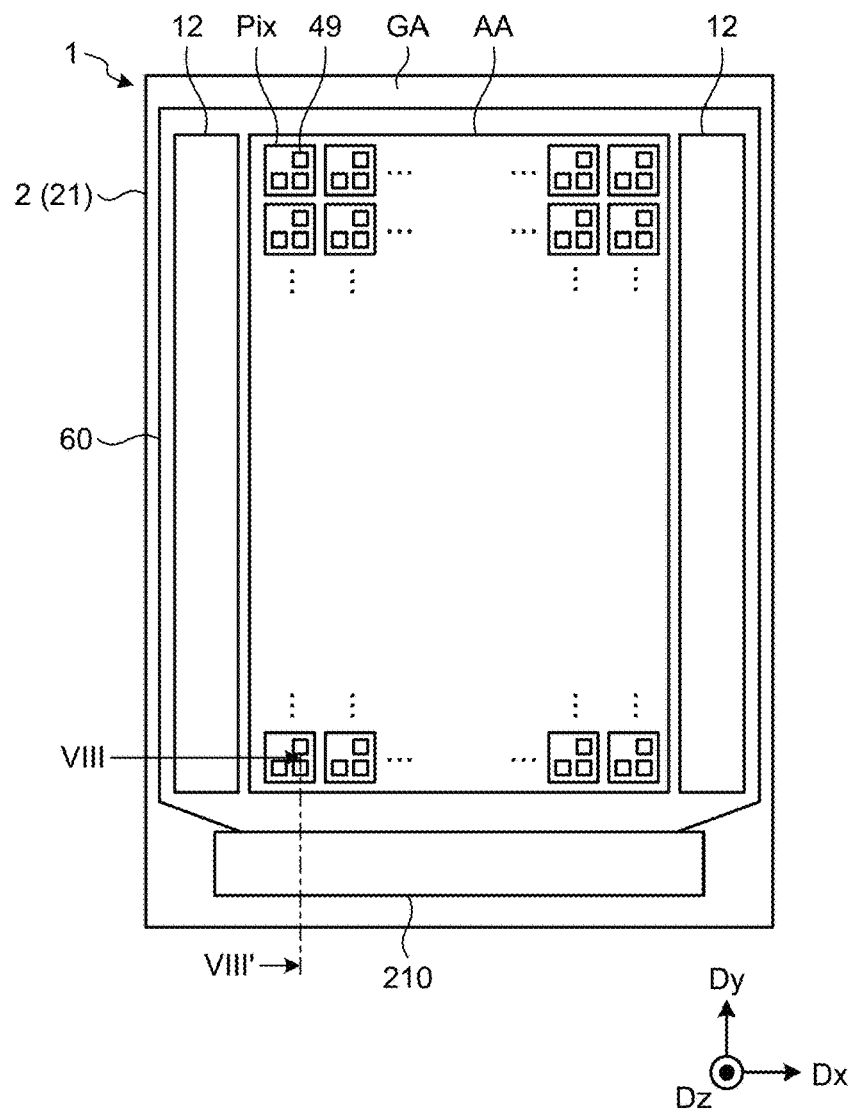
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

In the present specification and the accompanying claims, to express an aspect where a first structure is disposed on a second structure, the term "on" includes both of the following cases if not specially defined: the case where the first structure is disposed directly on the second structure in contact with the second structure and the case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a light emission control scanning line BG, a reset control scanning line RG, an initialization control scanning line IG, a writing control scanning line SG, and a heat generation control scanning line HG (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as chip on glass (COG). The mounting form of the drive IC 210 is not limited thereto, and the drive IC 210 may be mounted on FPCs or a rigid substrate coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are electrically coupled to the common cathode wiring 60 and supplied with a fixed potential (e.g., a ground potential). More specifically, a cathode terminal 32 (refer to FIG. 7) of the light emitting element 3 is coupled to the cathode wiring 60 via a cathode electrode 22 (second electrode).

Figure 2:
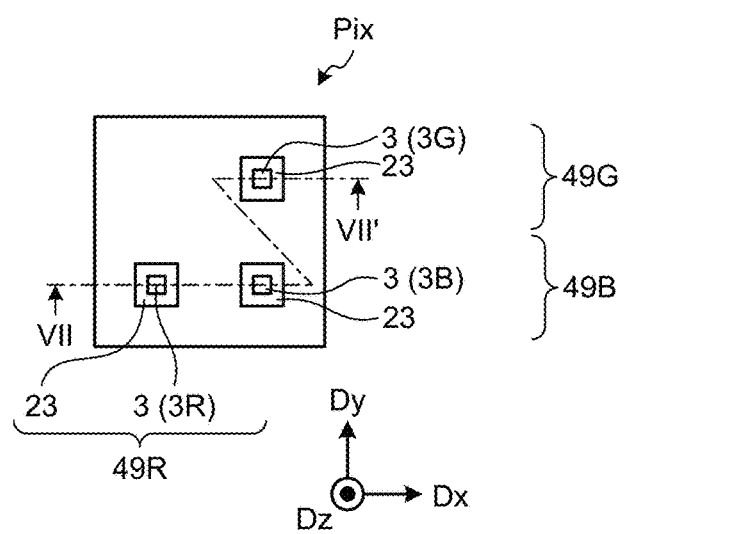
FIG. 2 is a plan view of a plurality of sub-pixels.

FIG. 2 is a plan view of a plurality of sub-pixels. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B in one pixel Pix are disposed side by side in the first direction Dx. The second sub-pixel 49G and the third sub-pixel 49B are disposed side by side in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include the light emitting element 3 and an anode electrode 23 (first electrode). The display device 1 displays an image by outputting different light (e.g., red, green, and blue light) from light emitting elements 3R, 3G, and 3B in the first sub-pixel 49R, the second sub-pixel 49G, and the third sub-pixel 49B, respectively. The light emitting elements 3 are provided to the respective sub-pixels 49. The light emitting element 3 is a light emitting diode (LED) chip having a size of approximately 3 μm to 300 μm in planar view and is called a micro LED. The display device 1 including the micro LEDs in the pixels is also called a micro LED display device. The term "micro" of the micro LED is not intended to limit the size of the light emitting element 3.

The light emitting elements 3 may output different light in four or more colors. The positions of the sub-pixels 49 are not limited to the configuration illustrated in FIG. 2. The first sub-pixel 49R, for example, may be disposed side by side with the second sub-pixel 49G in the first direction Dx. The first sub-pixel 49R, the second sub-pixel 49G, and the third sub-pixel 49B may be repeatedly arrayed in this order in the first direction Dx.

Figure 3:
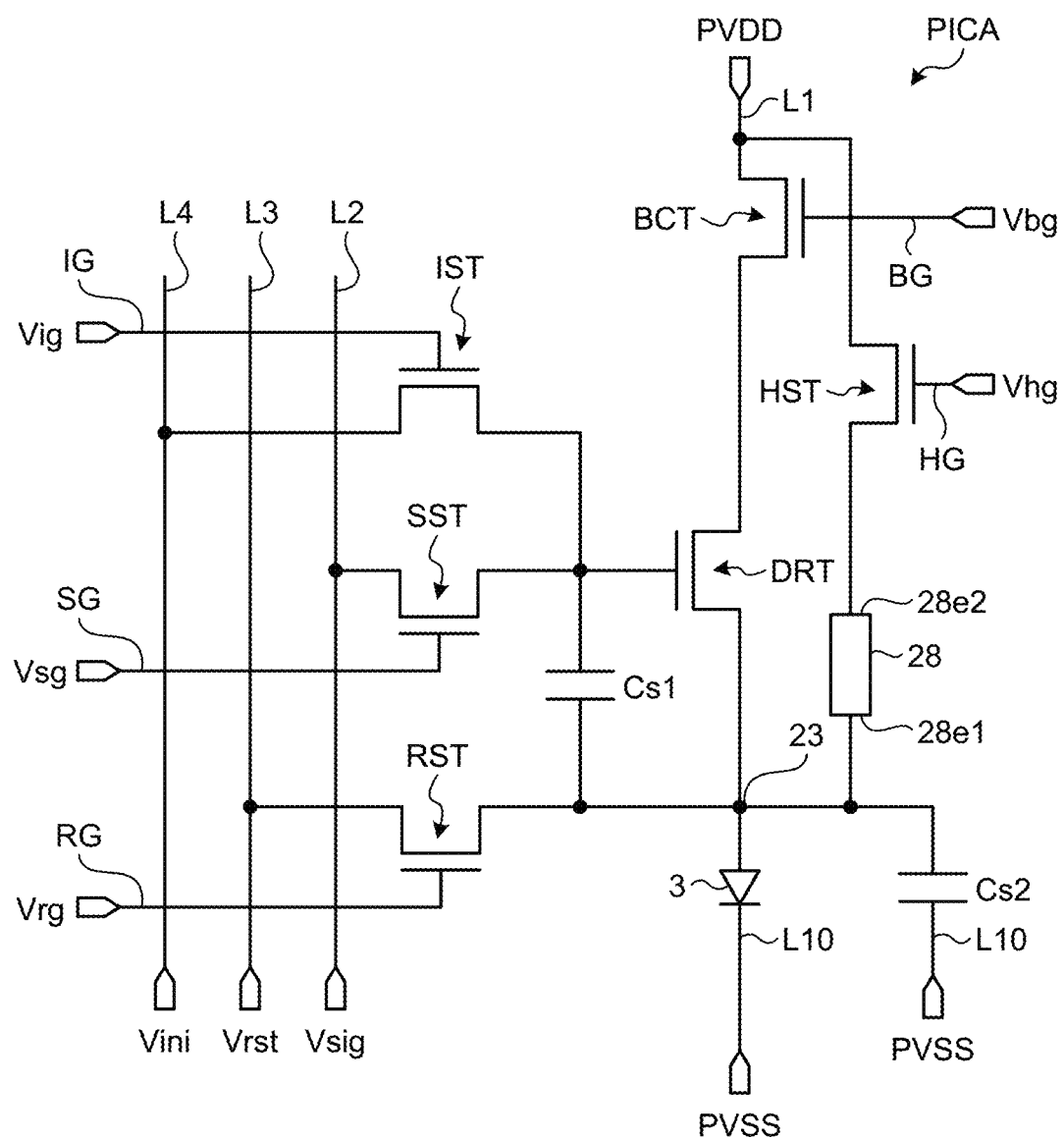
FIG. 3 is a circuit diagram of a pixel circuit.

FIG. 3 is a circuit diagram of a pixel circuit. A pixel circuit PICA illustrated in FIG. 3 is provided to each of the first sub-pixel 49R, the second sub-pixel 49G, and the third sub-pixel 49B. The pixel circuit PICA is provided to the substrate 21 to supply drive signals (electric current) to the light emitting element 3. The explanation of the pixel circuit PICA with reference to FIG. 3 is applicable to the respective pixel circuits PICA included in the first sub-pixel 49R, the second sub-pixel 49G, and the third sub-pixel 49B.

As illustrated in FIG. 3, the pixel circuit PICA includes the light emitting element 3, six transistors, two capacitances, and a heat generation resistor 28. Specifically, the pixel circuit PICA includes a light emission control transistor BCT, an initialization transistor IST, a writing transistor SST, a reset transistor RST, a drive transistor DRT, and a heat generation control transistor HST. Some of the transistors may be shared by the sub-pixels 49 disposed side by side. The light emission control transistor BCT, for example, may be shared by three sub-pixels 49 via common wiring. The reset transistors RST may be provided in the peripheral region GA and be each provided to one row of the sub-pixels 49, for example. In this case, the reset transistor RST is coupled to the sources of a plurality of drive transistors DRT via common wiring.

The transistors included in the pixel circuit PICA are n-type TFTs (thin-film transistors). The present embodiment is not limited thereto, and the transistors may be p-type TFTs. To use p-type TFTs, the coupling form of power supply potential, holding capacitance Cs1, and capacitance Cs2 may be appropriately adapted.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST. The heat generation control scanning line HG is coupled to the gate of the heat generation control transistor HST.

The light emission control scanning line BG, the initialization control scanning line IG, the writing control scanning line SG, the reset control scanning line RG, and the heat generation control scanning line HG are coupled to the drive circuits 12 (refer to FIG. 1) provided in the peripheral region GA. The drive circuits 12 supply light emission control signals Vbg, initialization control signals Vig, writing control signals Vsg, reset control signals Vrg, and heat generation control signals Vhg to the light emission control scanning line BG, the initialization control scanning line IG, the writing control scanning line SG, the reset control scanning line RG, and the heat generation control scanning line HG, respectively.

The drive IC 210 (refer to FIG. 1) supplies video signals Vsig to the respective pixel circuits PICA of the first sub-pixel 49R, the second sub-pixel 49G, and the third sub-pixel 49B in a time-division manner. A switching circuit, such as a multiplexer, is provided between each row of the first sub-pixels 49R, the second sub-pixels 49G, and the third sub-pixels 49B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, the reset transistor RST, and the heat generation control transistor HST each function as a switching element that selects electrical continuity and discontinuity between two nodes. The drive transistor DRT functions as an electric current control element that controls an electric current flowing through the light emitting element 3 based on voltage between the gate and the drain.

The cathode (cathode terminal 32) of the light emitting element 3 is coupled to a cathode power supply line L10 (second power supply line). The anode (anode terminal 33) of the light emitting element 3 is coupled to an anode power supply line L1 (first power supply line) via the drive transistor DRT and the light emission control transistor BCT. The anode power supply line L1 is supplied with anode power supply potential PVDD (first potential). The cathode power supply line L10 is supplied with cathode power supply potential PVSS (second potential). The anode power supply potential PVDD is higher than the cathode power supply potential PVSS. The cathode power supply line L10 includes the cathode wiring 60. Light emission operations of the light emitting element 3 will be described later.

A first end 28e1 of the heat generation resistor 28 is coupled to the anode electrode 23. A second end 28e2 of the heat generation resistor 28 is electrically coupled to the anode power supply line L1 via the heat generation control transistor HST.

The pixel circuit PICA includes the holding capacitance Cs1 and the capacitance Cs2. The holding capacitance Cs1 is capacitance formed between the gate and the source of the drive transistor DRT. The capacitance Cs2 is additional capacitance formed between the cathode power supply line L10 and both the source of the drive transistor DRT and the anode of the light emitting element 3.

Figure 4:
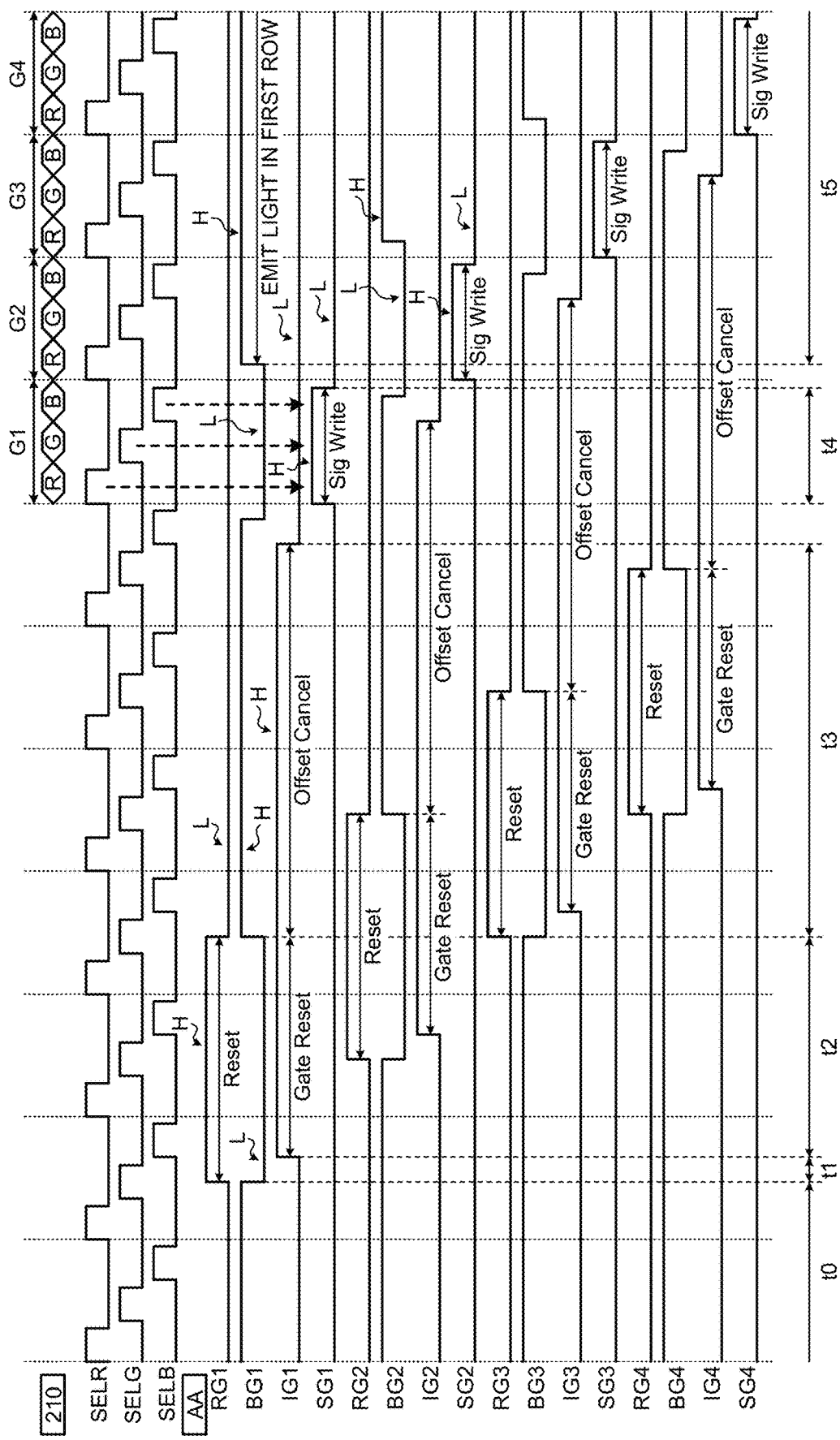
FIG. 4 is a timing chart of an exemplary operation performed by the display device.

FIG. 4 is a timing chart of exemplary operations of the display device. Periods G1 to G4 illustrated in FIG. 4 each correspond to one horizontal period. While FIG. 4 illustrates the operations for driving the sub-pixels 49 of the first row to the sub-pixels 49 of the fourth row, the sub-pixels 49 of the fifth row to the sub-pixels 49 of the last row are subsequently driven. In the following description, a frame period 1F indicates the period for driving the sub-pixels 49 of the first row to the sub-pixels 49 of the last row.

The following describes exemplary operations from period t0 to period t5 illustrated in FIG. 4 in greater detail. The period t0 is a pervious frame light emission period. In other words, in the period t0 before processing in a certain frame period 1F is started, the sub-pixels 49 maintain the light emission state of the previous frame.

The subsequent period t1 is a source initialization period for the drive transistor DRT. Specifically, in the period t1, the electric potential of a light emission control scanning line BG1 is switched to an L (low) level, and the electric potential of a reset control scanning line RG1 is switched to an H level by the control signals supplied from the drive circuits 12. As a result, the light emission control transistor BCT is turned off (electrically discontinuous state), and the reset transistor RST is turned on (electrically continuous state).

The light emission control scanning line BG1 indicates the light emission control scanning line BG coupled to the sub-pixels 49 of the first row. A light emission control scanning line BG2 indicates the light emission control scanning line BG coupled to the sub-pixels 49 of the second row. A light emission control scanning line BG3 indicates the light emission control scanning line BG coupled to the sub-pixels 49 of the third row. A light emission control scanning line BG4 indicates the light emission control scanning line BG coupled to the sub-pixels 49 of the fourth row. Similarly, other scanning lines, such as the reset control scanning lines RG1, RG2, RG3, and RG4, indicate the scanning lines of the respective rows.

In the period t1, an electric current from the anode power source line L1 is cut off by the light emission control transistor BCT in the sub-pixels 49 of the first row. Light emission from the light emitting elements 3 stops, and residual electric charges in the sub-pixels 49 flow outside through the reset transistor RST. As a result, the electric potential of the source of the drive transistor DRT is fixed to the reset power supply potential Vrst. The reset power supply potential Vrst is set to have a predetermined potential difference with respect to the cathode power supply potential PVSS. In this case, the potential difference between the reset power supply potential Vrst and the cathode power supply potential PVSS is smaller than the potential difference at which the light emitting element 3 starts to emit light.

The subsequent period t2 is a gate initialization period for the drive transistor DRT. Specifically, in the period t2, the electric potential of an initialization control scanning line IG1 is switched to the H level by the control signals supplied from the drive circuits 12. The initialization transistor IST is turned on. In the sub-pixels 49 belonging to the first row, the electric potential of the gate of the drive transistor DRT is fixed to the initialization potential Vini by the initialization transistor IST. The initialization potential Vini has an electric potential higher than a threshold of the drive transistor DRT with respect to the reset power supply potential Vrst. As a result, the drive transistor DRT is turned on. In the period t2, no electric current flows through the drive transistor DRT because the light emission control transistor BCT remains off.

The subsequent period t3 is an offset cancel operation period. Specifically, in the period t3, the electric potential of the light emission control scanning line BG1 is switched to the H level, and the electric potential of the reset control scanning line RG1 is switched to the L level by the control signals supplied from the drive circuits 12. As a result, the light emission control transistor BCT is turned on, and the reset transistor RST is turned off.

The drive transistor DRT is in the ON state by the operations performed in the period t2. As a result, an electric current is supplied to the drive transistor DRT from the anode power supply line L1 (anode power supply potential PVDD) via the light emission control transistor BCT.

At this stage, no electric current flows because voltage between the anode and the cathode of the light emitting element 3 is lower than light emission start voltage. Consequently, the source of the drive transistor DRT is charged by the anode power supply potential PVDD, whereby the electric potential of the source increases. The gate potential of the drive transistor DRT is the initialization potential Vini. When the source potential of the drive transistor DRT is equal to (Vini−Vth), the drive transistor DRT is turned off, and the increase in the electric potential stops. Vth indicates a threshold voltage Vth for the drive transistor DRT.

The threshold voltage Vth varies depending on the sub-pixels 49. Consequently, the source potential of the drive transistor DRT when the increase in the electric potential stops varies depending on the sub-pixels 49. In other words, voltage corresponding to the threshold voltage Vth of the drive transistor DRT is obtained in each of the sub-pixels 49 by the operations performed in the period t3. At this time, the light emitting element 3 is supplied with a voltage of ((Vini–Vth)–PVSS). No electric current flows through the light emitting element 3 because this voltage is lower than the light emission start voltage of the light emitting element 3.

The subsequent period t4 is a video signal writing operation period. Specifically, in the period t4, the electric potential of the light emission control scanning line BG1 is switched to the L level, the electric potential of the initialization control scanning line IG1 is switched to the L level, and the electric potential of a writing control scanning line SG1 is switched to the H level by the control signals supplied from the drive circuits 12.

As a result, the light emission control transistor BCT is turned off, the initialization transistor IST is turned off, and the writing transistor SST is turned on. In the period t4, the video signals Vsig are input to the gate of the drive transistor DRT in the sub-pixels 49 belonging to the first row. The gate potential of the drive transistor DRT changes from the initialization potential Vini to the electric potential of the video signal Vsig. By contrast, the source potential of the drive transistor DRT remains at (Vini–Vth). As a result, the voltage between the gate and the source of the drive transistor DRT is equal to (Vsig–(Vini–Vth)) and reflects variations in the threshold voltage Vth between the sub-pixels 49.

The video signal line L2 extends in the second direction Dy (refer to FIG. 1) and is coupled to the sub-pixels 49 of a plurality of rows belonging to the same column. Consequently, the period t4 for performing the video writing operation is carried out row by row.

The subsequent period t5 is a light emission operation period. Specifically, in the period t5, the electric potential of the light emission control scanning line BG1 is switched to the H level, and the electric potential of the writing control scanning line SG1 is switched to the L level by the control signals supplied from the drive circuits 12. As a result, the light emission control transistor BCT is turned on, and the writing transistor SST is turned off. An electric current is supplied to the drive transistor DRT from the anode power supply line L1 (anode power supply potential PVDD) via the light emission control transistor BCT.

The drive transistor DRT supplies an electric current corresponding to the voltage between the gate and the source set until the period t4 to the light emitting element 3. The light emitting element 3 emits light at the luminance corresponding to the electric current. At this time, the voltage between the anode and the cathode of the light emitting element 3 is a voltage corresponding to the value of the voltage supplied via the drive transistor DRT. As a result, the electric potential of the anode of the light emitting element 3 increases. The voltage between the gate and the source of the drive transistor DRT is held by the holding capacitance Cs1. Consequently, the gate potential of the drive transistor DRT also increases in association with the increase in the electric potential of the anode of the light emitting element 3 due to coupling of the holding capacitance Cs1.

In an actual operation, the increase in the gate potential of the drive transistor DRT is slightly smaller than the increase in the electric potential of the anode because additional capacitance, such as the capacitance Cs2, is present in the gate of the drive transistor DRT besides the holding capacitance Cs1. Because this value is already known, the electric potential of the video signal Vsig can be determined so as to obtain a desired current value in the final voltage between the gate and the source of the drive transistor DRT.

After the operations described above are completed from the first row to the last row, an image of one frame is displayed. The reset operation for the sub-pixels 49 belonging to the second row is performed in a period overlapping the periods t2 and t3. The offset cancel operation for the sub-pixels 49 belonging to the second row is performed in a period overlapping the periods t3 and t4. The video signal writing operation for the sub-pixels 49 belonging to the second row is performed in a period overlapping the period t5. Subsequently, the operations described above are repeated, thereby displaying video.

While the sub-pixels 49 of one row are driven from the period t1 to the period t5 in the exemplary operations illustrated in FIG. 4, the present embodiment is not limited thereto. The drive circuits 12 may simultaneously drive the sub-pixels 49 of two rows or three or more rows.

The configuration of the pixel circuit PICA illustrated in FIG. 3 and the exemplary operations illustrated in FIG. 4 are given by way of example only and may be appropriately modified. The number of wires and the number of transistors in one sub-pixel 49, for example, may be different from those described above. The pixel circuit PICA may have a configuration of a current mirror circuit, for example.

Figure 5:
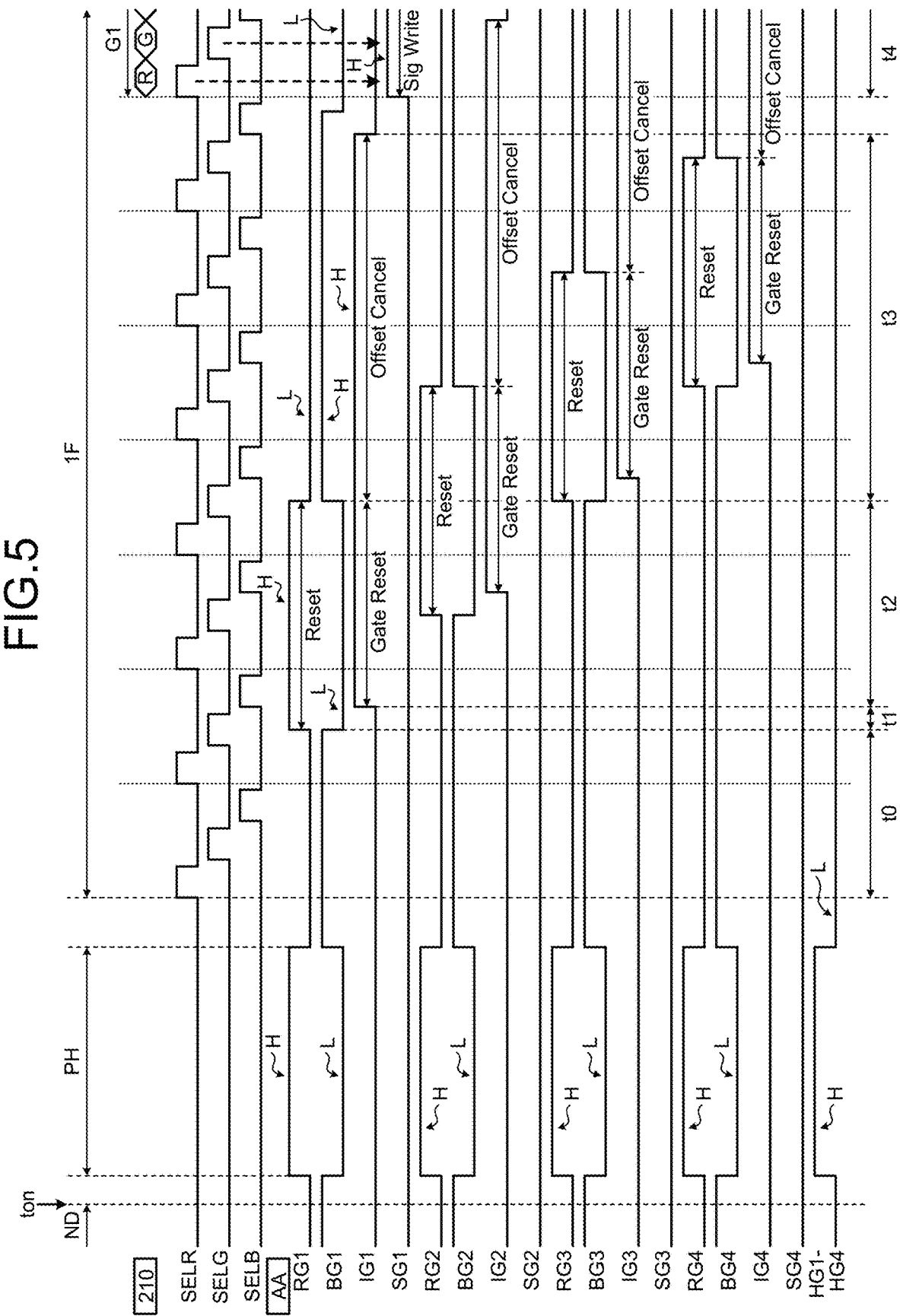
FIG. 5 is a timing chart of an exemplary operation performed by the display device when it starts.

FIG. 5 is a timing chart of an exemplary operation performed by the display device when it starts. As illustrated in FIG. 5, the display device 1 has a preheating period PH between a non-display period NDP and the frame period 1F. The non-display period NDP is a period when the display device 1 stops displaying an image. The non-display period NDP includes a period when the display device 1 is turned off and a period in a sleep mode for stopping display if no input operation is performed for a predetermined period of time, for example.

If the display device 1 is turned on, or an operation for returning from the sleep mode is performed at time ton, the drive IC 210 performs the preheating period PH. Specifically, the electric potential of the reset control scanning lines RG belonging to the respective rows is switched to the H level, the electric potential of the heat generation control scanning lines HG is switched to the H level, and the electric potentials of the light emission control scanning lines BG, the initialization control scanning lines IG, and the writing control scanning lines SG are switched to the L level by various control signals supplied from the drive circuits 12.

As a result, the heat generation control transistor HST and the reset transistor RST are turned on, and the other transistors are turned off. The anode power supply line L1, the heat generation control transistor HST, the heat generation resistor 28, the reset transistor RST, and the reset signal line L3 are electrically coupled to form a current path. Consequently, the anode power supply line L1 (anode power supply potential PVDD) supplies an electric current to the heat generation resistor 28 via the heat generation control transistor HST.

As a result, the temperature of the heat generation resistor 28 rises. The heat generated in the heat generation resistor 28 is transmitted to the light emitting element 3 because the heat generation resistor 28 is provided to the pixel circuit PICA. As a result, the temperature of the light emitting element 3 rises. The electric potential supplied from the anode power supply line L1 in the preheating period PH may be different from the anode power supply potential PVDD supplied in the frame period 1F. Consequently, the display device 1 can appropriately adjust the electric current flowing through the heat generation resistor 28, thereby controlling heat generation in the heat generation resistor 28.

After the electric current is supplied to the heat generation resistor 28 for a predetermined period of time, the electric potentials of the reset control scanning lines RG and the heat generation control scanning lines HG belonging to the respective rows are switched to the L level, and the electric potential of the light emission control scanning lines BG is switched to the H level. As a result, supply of the electric current to the heat generation resistor 28 is stopped. Subsequently, the display device 1 performs display in the frame period 1F described above.

In the exemplary operation illustrated in FIG. 5, the heat generation resistors 28 belonging to the sub-pixels 49 of four rows are simultaneously driven in the preheating period PH. The present embodiment is not limited thereto. The drive circuits 12 may simultaneously drive the heat generation resistors 28 belonging to the sub-pixels 49 of three or less or five or more rows. Alternatively, the drive circuits 12 may simultaneously drive all the heat generation resistors 28 belonging to the sub-pixels 49 of the first row to the last row.

Figure 6:
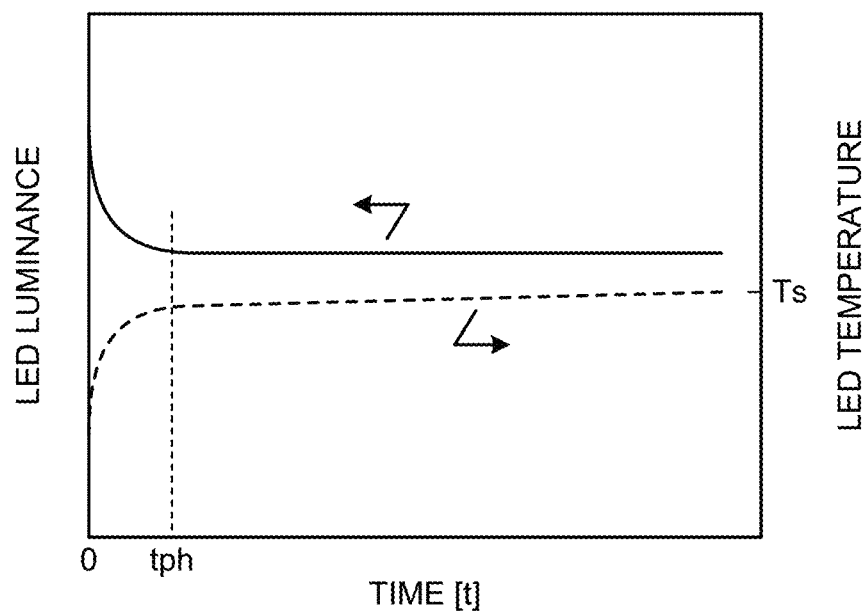
FIG. 6 is a graph schematically illustrating the relation between luminance and temperature of a light emitting element and time according to a comparative example.

FIG. 6 is a graph schematically illustrating the relation between luminance and temperature of the light emitting element and time according to a comparative example. The horizontal axis of the graph illustrated in FIG. 6 indicates time during which an electric current is supplied to the light emitting element 3. Time t=0 indicates the time when supply of an electric current to the light emitting element 3 starts. The vertical axis of the graph illustrated in FIG. 6 indicates luminance and temperature of the light emitting element 3.

As illustrated in FIG. 6, the light emitting element 3 according to the comparative example has the temperature characteristics that the luminous efficacy decreases with a rise in temperature. Specifically, if the temperature of the light emitting element 3 rises in a period from time t=0, when the electric current starts to flow through the light emitting element 3 according to the comparative example, to time tph, the luminance (luminous efficacy) decreases, and the light emission operation becomes unstable. After the time tph, the light emitting element 3 has a constant temperature Ts, and the luminance becomes stable.

In the preheating period PH, the light emitting element 3 according to the present embodiment is heated in advance by the heat generation resistor 28. In this period, no electric current flows through the light emitting element 3. The frame period 1F starts after the temperature of the light emitting element 3 rises to the temperature Ts illustrated in FIG. 6, for example. With this mechanism, the display device 1 can prevent a rise in temperature of the light emitting element 3 when an electric current flows through the light emitting element 3 in the period t5 (light emission operation period). In other words, the light emitting element 3 starts to be supplied with the electric current and driven in a region where the light emission operation is made stable after the time tph illustrated in FIG. 6. Consequently, the display device 1 can prevent reduction in luminance (luminous efficacy) with a rise in temperature of the light emitting element 3. As a result, the display device 1 can prevent deterioration of display characteristics.

Figure 7:
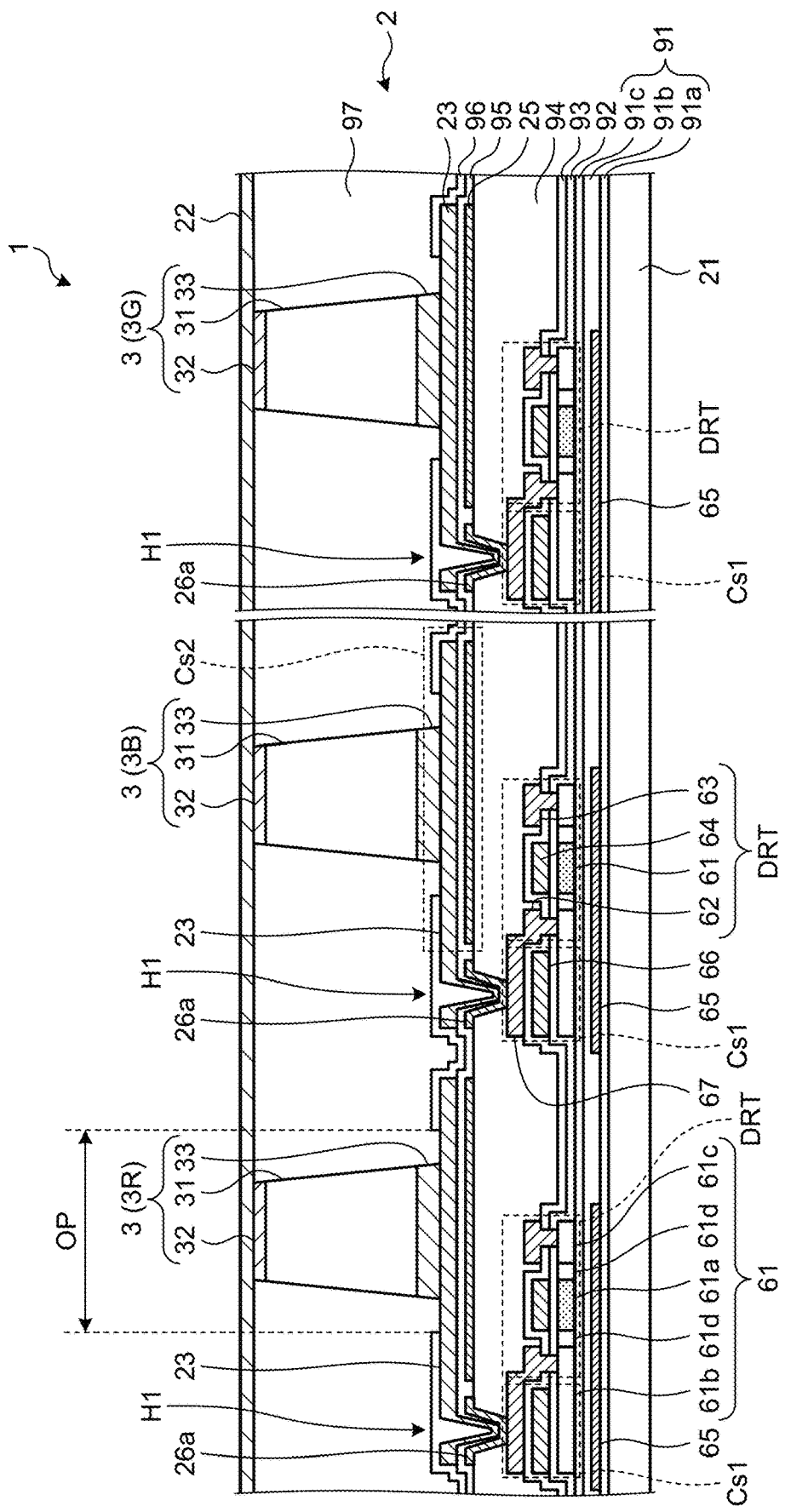
FIG. 7 is a sectional view along line VII-VII' of FIG. 2.
Figure 8:
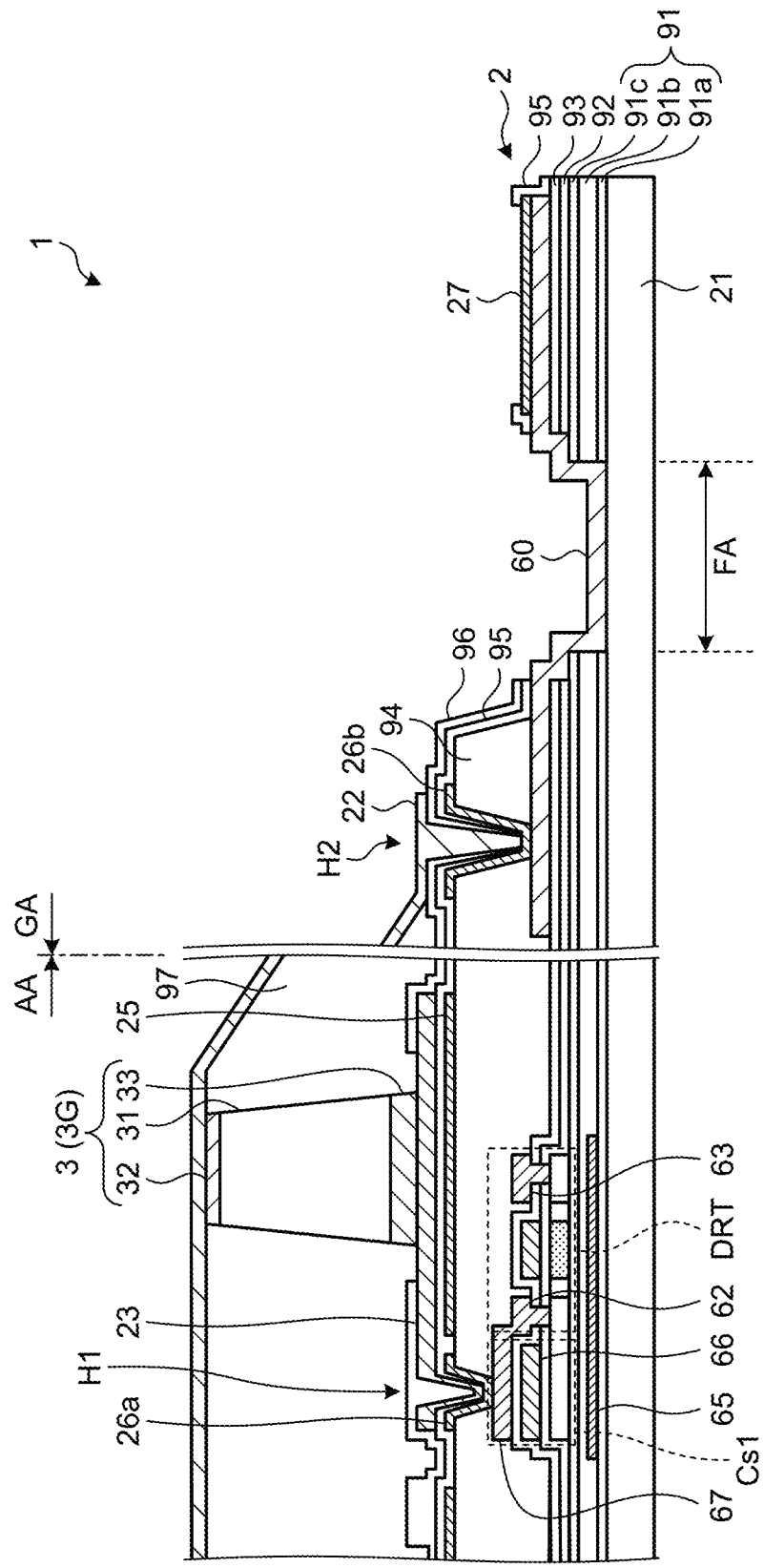
FIG. 8 is a sectional view along line VIII-VIII' of FIG. 1.

The following describes a sectional configuration of the display device 1. FIG. 7 is a sectional view along line VII-VII' of FIG. 2. FIG. 8 is a sectional view along line VIII-VIII' of FIG. 1. As illustrated in FIG. 7, the light emitting elements 3 are provided on the array substrate 2. The array substrate 2 includes the substrate 21, the anode electrode 23, a counter electrode 25, a coupling electrode 26a, the heat generation resistor 28 (refer to FIG. 10), various transistors, various kinds of wiring, and various insulating films.

The substrate 21 is an insulating substrate and is a glass substrate made of quartz or non-alkali glass or a resin substrate made of polyimide, for example. If the substrate 21 is a flexible resin substrate, the display device 1 may be provided as a sheet display. The substrate 21 is not necessarily made of polyimide and may be made of other resin materials.

In the present specification, the direction from the substrate 21 toward the light emitting element 3 in the direction perpendicular to the surface of the substrate 21 is referred to as "upper side" or simply as "on". The direction from the light emitting element 3 toward the substrate 21 is referred to as "lower side" or simply as "under".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film. The lower insulating film 91a is provided to improve adhesion between the substrate 21 and the undercoat film 91. The middle insulating film 91b is provided as a block film that prevents water and impurities from entering from outside. The upper insulating film 91c is provided as a block film that prevents hydrogen atoms contained in the silicon nitride film of the insulating film 91b from diffusing toward a semiconductor layer 61.

The structure of the undercoat film 91 is not limited to that illustrated in FIG. 7. The undercoat film 91 may be a single-layered film or a two-layered film, for example, or may be a multilayered film having four or more layers. If the substrate 21 is a glass substrate, the silicon nitride film may be formed directly on the substrate 21 because silicon nitride films have relatively high adhesion.

A light shielding film 65 is provided on the insulating film 91a. The light shielding film 65 is provided between the semiconductor layer 61 and the substrate 21. The light shielding film 65 can prevent light from entering into a channel region 61a of the semiconductor layer 61 from the substrate 21. Alternatively, the light shielding film 65 may be made of conductive material and supplied with a predetermined electric potential. As a result, the light shielding film 65 may have a back-gate effect on a drive transistor DRT. The light shielding film 65 may be provided on the substrate 21, and the insulating film 91a may be provided covering the light shielding film 65.

The drive transistor DRT is provided on the undercoat film 91. While the drive transistor DRT out of the transistors is illustrated in FIG. 7, the light emission control transistor BCT, the initialization transistor IST, the writing transistor SST, the reset transistor RST, and the heat generation control transistor HST included in the pixel circuit PICA also have the same multilayered structure as that of the drive transistor DRT.

The drive transistor DRT includes the semiconductor layer 61, a source electrode 62, a drain electrode 63, and a gate electrode 64. The semiconductor layer 61 is provided on the undercoat film 91. The semiconductor layer 61 is made of polysilicon, for example. The material of the semiconductor layer 61 is not limited thereto, and the semiconductor layer 61 may be made of a microcrystalline oxide semiconductor, an amorphous oxide semiconductor, or low-temperature polysilicon, for example. While only an n-type TFT is provided as the drive transistor DRT, a p-type TFT may be simultaneously formed. In the n-type TFT, the semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. The gate electrode 64 is provided on the gate insulating film 92. First wiring 66 is provided in the same layer as the gate electrode 64. The gate electrode 64 and the first wiring 66 are made of molybdenum tungsten (MoW), for example. While the drive transistor DRT in the example illustrated in FIG. 7 has a top-gate structure in which the gate electrode 64 is provided on the semiconductor layer 61, the structure of the drive transistor DRT is not limited thereto. The drive transistor DRT may have a bottom-gate structure in which the gate electrode 64 is provided under the semiconductor layer 61 or a dual-gate structure in which the gate electrodes 64 are provided both on and under the semiconductor layer 61.

An interlayer insulating film 93 is provided on the gate insulating film 92 to cover the gate electrode 64. The interlayer insulating film 93 has a multilayered structure of a silicon nitride film and a silicon oxide film, for example. The source electrode 62 and the drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is provided in a region overlapping the first wiring 66. The first wiring 66 and the second wiring 67 facing each other with the interlayer insulating film 93 interposed therebetween form holding capacitance Cs1. The first wiring 66 is provided in a region overlapping part of the semiconductor layer 61. The holding capacitance Cs1 includes capacitance formed by the semiconductor layer 61 and the first wiring 66 facing each other with the gate insulating film 92 interposed therebetween.

A flattening film 94 is provided on the interlayer insulating film 93 to cover the drive transistor DRT and the second wiring 67. The flattening film 94 is made of organic material, such as photosensitive acrylic. Organic material, such as photosensitive acrylic, is excellent in coverage property for difference in level of wiring and surface flatness compared with inflattening material formed by CVD, for example.

The counter electrode 25, a capacitance insulating film 95, the anode electrode 23, and an anode electrode insulating film 96 are layered in order on the flattening film 94. The counter electrode 25 is made of translucent conductive material, such as indium tin oxide (ITO). The coupling electrode 26a is provided in the same layer as the counter electrode 25. The coupling electrode 26a is provided covering the inside of a contact hole H1 formed in the flattening film 94 and is coupled to the second wiring 67 at the bottom of the contact hole H1.

The capacitance insulating film 95 is provided covering the counter electrode 25 and the coupling electrode 26a and has an opening in a region overlapping the contact hole H1. The capacitance insulating film 95 is a silicon nitride film, for example. The anode electrode 23 faces the counter electrode 25 with the capacitance insulating film 95 interposed therebetween. The anode electrode 23 is electrically coupled to the coupling electrode 26a and the second wiring 67 through the contact hole H1. As a result, the anode electrode 23 is electrically coupled to the drive transistor DRT. The anode electrode 23 has a multilayered structure of Mo and Al. The material of the anode electrode 23 is not limited thereto, and the anode electrode 23 may be made of material including at least one of metals of Mo and Ti. Alternatively, the anode electrode 23 may be made of alloy including at least one of Mo and Ti or translucent conductive material.

Capacitance Cs2 is formed between the anode electrode 23 and the counter electrode 25 facing each other with the capacitance insulating film 95 interposed therebetween. The counter electrode 25 made of ITO also serves as a barrier film that protects various kinds of wiring, such as the second wiring 67, in forming the anode electrode 23. In patterning the anode electrode 23, the counter electrode 25 is partially exposed to etching environment. By annealing performed between formation of the counter electrode 25 and formation of the anode electrode 23, the counter electrode 25 has sufficient resistance to etching for the anode electrode 23.

The anode electrode insulating film 96 is provided to cover the anode electrode 23. The anode electrode insulating film 96 is a silicon nitride film, for example. The anode electrode insulating film 96 covers the periphery of the anode electrode 23 and insulates the anode electrodes 23 of the sub-pixels 49 disposed side by side.

The anode electrode insulating film 96 has an opening OP for mounting the light emitting element 3 at a position overlapping the anode electrode 23. The size of the opening OP is larger than the area of the light emitting element 3 considering the amount of mounting misalignment in the process of mounting the light emitting element 3, for example. In other words, the area of the anode electrode 23 is larger than that of the light emitting element 3 in planar view seen from the direction perpendicular to the substrate 21. The light emitting element 3 includes at least two terminals (the anode terminal 33 and the cathode terminal 32). The area of the anode electrode 23 is larger than that of at least one of the two terminals (the anode terminal 33 and the cathode terminal 32) in planar view seen from the direction perpendicular to the substrate 21. If the mounting area of the light emitting element 3 is approximately 10 μm×10 μm in planar view, for example, the area of the opening OP is preferably secured to be approximately 20 μm×20 μm.

The light emitting elements 3R, 3G, and 3B are each mounted on the corresponding anode electrode 23. The light emitting element 3 is mounted such that the anode terminal 33 is in contact with the anode electrode 23. The light emitting element 3 includes a semiconductor layer 31, the cathode terminal 32, and the anode terminal 33. The semiconductor layer 31 may have a multilayered structure of an n-type cladding layer, an active layer, and a p-type cladding layer.

The semiconductor layer 31 is made of a compound semiconductor, such as gallium nitride (GaN) and aluminum indium phosphorous (AlInP). The semiconductor layer 31 may be made of different materials depending on the light emitting elements 3R, 3G, and 3B. The active layer may have a multi-quantum well structure (MQW structure) in which well layers and barrier layers composed of several atomic layers are cyclically layered for high efficiency. In the light emitting element 3, the semiconductor layer 31 may be provided on a semiconductor substrate. The light emitting element 3 is not necessarily mounted alone on the array substrate 2, and an LED chip including the light emitting element 3 may be mounted on the array substrate 2. The LED chip includes a light emitting element substrate, the light emitting element 3 provided to the light emitting element substrate, and a circuit element group provided to the light emitting element substrate and configured to drive the light emitting element 3, for example. The light emitting element substrate, the light emitting element 3, and the circuit element group are integrated in one chip.

An element insulating film 97 is provided between a plurality of light emitting elements 3. The element insulating film 97 is made of resin material. The element insulating film 97 covers the side surfaces of the light emitting element 3, and the cathode terminal 32 of the light emitting element 3 is exposed from the element insulating film 97. The element insulating film 97 is flattened such that the upper surface of the element insulating film 97 and the upper surface of the cathode terminal 32 form a single plane. The position of the upper surface of the element insulating film 97 may be different from that of the upper surface of the cathode terminal 32.

The cathode electrode 22 covers a plurality of light emitting elements 3 and the element insulating film 97 and is electrically coupled to the light emitting elements 3. More specifically, the cathode electrode 22 is provided across the upper surface of the element insulating film 97 and the upper surface of the cathode terminal 32. The cathode electrode 22 is made of translucent conductive material, such as ITO. With this configuration, the light output from the light emitting elements 3 can be efficiently extracted to the outside. The cathode electrode 22 is electrically coupled to the cathode terminals 32 of the light emitting elements 3 mounted on the display region AA.

As illustrated in FIG. 8, the cathode electrode 22 is coupled to the cathode wiring 60 provided on the array substrate 2 via a cathode contact part (contact hole H2) formed outside the display region AA. FIG. 8 illustrates both the peripheral region GA and the display region AA to facilitate the reader's understanding the correspondence relation between the sectional configuration of the peripheral region GA and the sectional configuration of the display region AA.

As illustrated in FIG. 8, the display device 1 includes a terminal part 27, a bending region FA, and the cathode contact part (contact hole H2) in the peripheral region GA. The terminal part 27 is a terminal coupled to the drive IC 210 or a wiring substrate, such as a flexible printed circuit board. The bending region FA is a region for bending the peripheral region GA closer to the terminal part 27 on the array substrate 2. To provide the bending region FA, the substrate 21 is made of resin material having flexibility.

Specifically, the undercoat film 91, the gate insulating film 92, and the interlayer insulating film 93 extend to the end of the substrate 21 from the display region AA to the peripheral region GA. The undercoat film 91, the gate insulating film 92, and the interlayer insulating film 93 are removed in the bending region FA. The undercoat film 91, the gate insulating film 92, and the interlayer insulating film 93 are removed by etching in the bending region FA. In this case, the surface of the substrate 21 made of resin material, such as polyimide, may possibly be partially eroded and have a recess.

The cathode wiring 60 is provided on the interlayer insulating film 93. In other words, the cathode wiring 60 is provided in the same layer and is made of the same material as that of the source electrode 62, the drain electrode 63, and the second wiring 67. The cathode wiring 60 is provided over the bending region FA along the steps formed by the undercoat film 91, the gate insulating film 92, the interlayer insulating film 93, and the substrate 21. The cathode wiring 60 is provided on the substrate 21 in the bending region FA and on the interlayer insulating film 93 between the bending region FA and the substrate 21.

The flattening film 94 is removed in the bending region FA and a region between the bending region FA and the end of the substrate 21 in the peripheral region GA. The flattening film 94 has the contact hole H2 in a region between the bending region FA and the display region AA. The cathode wiring 60 is exposed at the bottom surface of the contact hole H2, and the thickness of the element insulating film 97 becomes thinner from the periphery of the display region AA toward the peripheral region GA. The cathode electrode 22 is electrically coupled to the cathode wiring 60 via a coupling electrode 26b provided in the contact hole H2. The coupling electrode 26b is provided in the same layer as that of the counter electrode 25 and the coupling electrode 26a, and is made of the same material as that of the counter electrode 25 and the coupling electrode 26a.

The terminal part 27 is provided on the cathode wiring 60 in a region between the bending region FA and the end of the substrate 21. The capacitance insulating film 95 is provided to cover the terminal part 27 and has an opening in a region overlapping the terminal part 27.

As described above, the display device 1 with the light emitting elements 3 serving as display elements is provided. The display device 1 may include a cover glass, a touch panel, and other components on the cathode electrode 22 as needed. In this case, a filler made of resin or the like may be provided between the display device 1 and the member, such as a cover glass. The display device 1 does not necessarily have a face-up structure in which the upper part of the light emitting element 3 is coupled to the cathode electrode 22. The display device 1 may have what is called a face-down structure in which the lower part of the light emitting element 3 is coupled to the anode electrode 23 and the cathode electrode 22.

Figure 9:
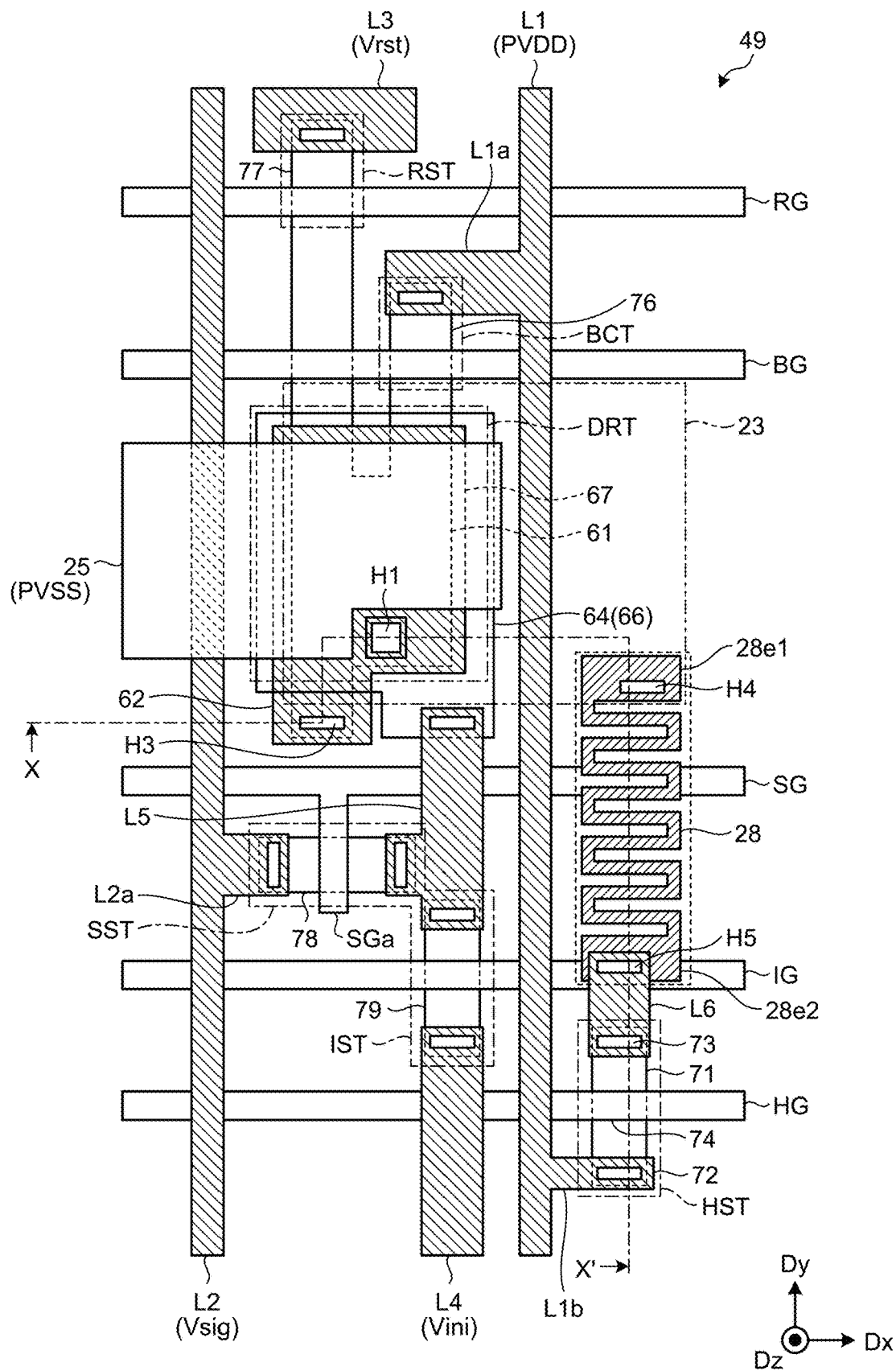
FIG. 9 is an enlarged plan view of one sub-pixel of the display device according to the first embodiment.
Figure 10:
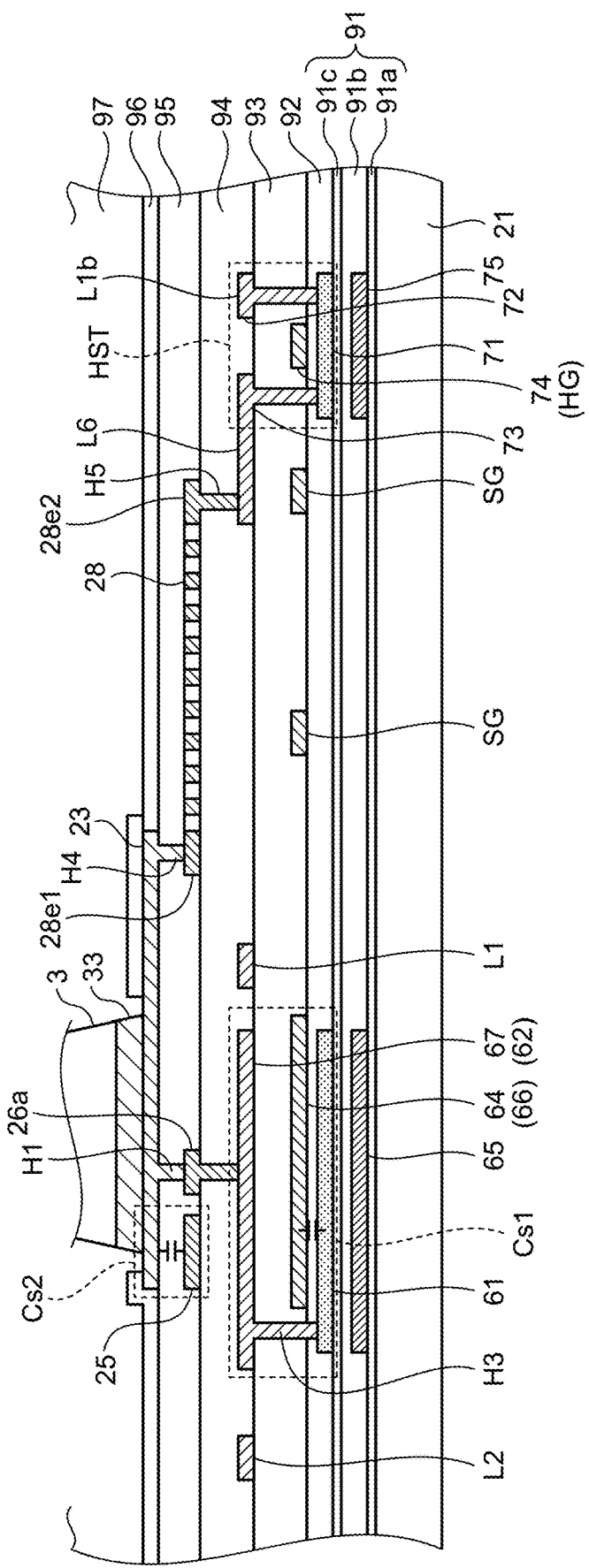
FIG. 10 is a sectional view along line X-X' of FIG. 9.

The following describes the configuration of the sub-pixel 49 and the heat generation resistor 28 in greater detail. FIG. 9 is an enlarged plan view of one sub-pixel of the display device according to the first embodiment. FIG. 10 is a sectional view along line X-X' of FIG. 9. To simplify the drawing, FIG. 9 does not illustrate the light emitting element 3. In FIG. 9, the anode electrode 23 is represented by an alternate long and two short dashes line, and the anode power supply line L1, the video signal line L2, the reset signal line L3, the initialization signal line L4, coupling wiring L5 and L6, and the heat generation resistor 28 are hatched. Semiconductor layers 61, 71, 76, 77, 78, and 79 included in the respective transistors are represented by dotted lines.

As illustrated in FIG. 9, the anode power supply line L1, the video signal line L2, and the initialization signal line L4 extend in the second direction Dy. The reset signal line L3 is provided between the anode power supply line L1 and the video signal line L2. While the reset signal line L3 is simply illustrated to simplify the drawing, it extends in the second direction Dy like the anode power supply line L1 and other lines.

The reset control scanning line RG, the light emission control scanning line BG, the writing control scanning line SG, the initialization control scanning line IG, and the heat generation control scanning line HG extend in the first direction Dx and intersect the anode power supply line L1 and the video signal line L2 in planar view. The coupling wiring L5 couples the drive transistor DRT, the initialization transistor IST, and the writing transistor SST. The coupling wiring L6 couples the heat generation resistor 28 and the heat generation control transistor HST.

The semiconductor layer 61, the source electrode 62 (second wiring 67), and the gate electrode 64 (first wiring 66) constituting the drive transistor DRT are provided in a region surrounded by the anode power supply line L1, the video signal line L2, the light emission control scanning line BG, and the writing control scanning line SG. The semiconductor layer 61 is coupled to the source electrode (second wiring 67) through a contact hole H3 at a part not overlapping the gate electrode 64 (first wiring 66). The anode electrode 23 and the counter electrode 25 are provided in a region overlapping the drive transistor DRT. The counter electrode 25 is coupled to the cathode power supply line L10 and is supplied with the cathode power supply potential PVSS. With this configuration, the counter electrode 25 can shield the anode electrode 23 and the light emitting element 3 from the transistors and the various kinds of wiring on the array substrate 2.

The anode electrode 23 extends in a region not overlapping the drive transistor DRT and part of the anode electrode 23 overlaps the first end 28e1 of the heat generation resistor 28. The heat generation resistor 28 has a meander wiring pattern in planar view and extends in the second direction Dy along the anode power supply line L1 as a whole. The first end 28e1 of the heat generation resistor 28 is coupled to the anode electrode 23 through a contact hole H4. The second end 28e2 of the heat generation resistor 28 is coupled to the coupling wiring L6 through a contact hole H5.

The heat generation control transistor HST includes the semiconductor layer 71, a source electrode 72, a drain electrode 73, and a gate electrode 74. The semiconductor layer 71 extends in the second direction Dy and intersects the heat generation control scanning line HG in planar view. The region of the semiconductor layer 71 overlapping the heat generation control scanning line HG serves as a channel region. The part of the heat generation control scanning line HG overlapping the semiconductor layer 71 functions as the gate electrode 74 of the heat generation control transistor HST. One end of the semiconductor layer 71 is coupled to an anode power supply line coupling part L1b. The other end of the semiconductor layer 71 is coupled to the coupling wiring L6. The anode power supply line coupling part L1b is a part branched off from the anode power supply line L1 in the first direction Dx. Part of the anode power supply line coupling part L1b and part of the coupling wiring L6 function as the source electrode 72 and the drain electrode 73, respectively.

With this configuration, the first end 28e1 of the heat generation resistor 28 is electrically coupled to the anode electrode 23. The second end 28e2 of the heat generation resistor 28 is electrically coupled to the anode power supply line L1 via the heat generation control transistor HST.

The light emission control transistor BCT includes the semiconductor layer 76. The semiconductor layer 76 is coupled to the semiconductor layer 61 of the drive transistor DRT and intersects the light emission control scanning line BG in planar view. One end of the semiconductor layer 76 is electrically coupled to an anode power supply line coupling part L1a. The anode power supply line coupling part L1a is a part branched off from the anode power supply line L1 in the first direction Dx. With this configuration, the drive transistor DRT and the light emission control transistor BCT are electrically coupled to the anode power supply line L1.

The reset transistor RST includes the semiconductor layer 77. One end of the semiconductor layer 77 is coupled to the reset signal line L3, and the other end of the semiconductor layer 77 is coupled to the semiconductor layer 61 of the drive transistor DRT. The semiconductor layer 77 extends in the second direction Dy and intersects the light emission control scanning line BG and the reset control scanning line RG in planar view. The part of the semiconductor layer 77 overlapping the reset control scanning line RG serves as a channel region.

The semiconductor layer 77 and the semiconductor layer 76 are coupled to the semiconductor layer 61, thereby constructing the coupling configuration of the drive transistor DRT, the light emission control transistor BCT, and the reset transistor RST illustrated in the circuit diagram in FIG. 3.

The writing transistor SST includes the semiconductor layer 78. One end of the semiconductor layer 78 is coupled to a video signal line coupling part L2a. The video signal line coupling part L2a is a part branched off from the video signal line L2 in the first direction Dx. The other end of the semiconductor layer 78 is coupled to the coupling wiring L5. The semiconductor layer 78 extends in the first direction Dx and intersects a branch SGa in planar view. The branch SGa is a part branched off from the writing control scanning line SG in the second direction Dy.

The initialization transistor IST includes the semiconductor layer 79. One end of the semiconductor layer 79 is coupled to the initialization signal line L4. The other end of the semiconductor layer 79 is coupled to the coupling wiring L5. The semiconductor layer 79 extends in the second direction Dy and intersects the initialization control scanning line IG in planar view.

As illustrated in FIG. 10, the heat generation resistor 28 is provided on the flattening film 94. The heat generation resistor 28 is provided in the same layer as that of the counter electrode 25. The video signal line L2, the heat generation resistor 28, and the anode electrode 23 are layered in order in the direction perpendicular to the substrate 21. The heat generation resistor 28 is made of the same material as that of the counter electrode 25, that is, translucent conductive material, such as ITO. The heat generation resistor 28 has sheet resistance higher than that of the anode electrode 23 and satisfactorily converts electrical energy into heat when an electric current flows through the heat generation resistor 28. The material of the heat generation resistor 28 is not limited to ITO and may be a translucent conductive film obtained by doping $In_2O_3$ with Ge, Mo, F, Ti, Zr, Hf, Nb, Ta, W or Te, a translucent conductive film obtained by doping ZnO with Al, Ga, B, In, Y, Sc, F, V, Si, Ge, Ti, Zr, or Hf, or a translucent conductive film obtained by doping $SnO_2$ with Sb, F, As, Nb, or Ta. Alternatively, the heat generation resistor 28 may be made of refractory material, such as molybdenum (Mo) or Mo alloy, tungsten (W) or W alloy, and titanium (Ti) or Ti alloy.

The heat generation resistor 28 is provided in a layer different from that of the anode electrode 23 with the capacitance insulating film 95 interposed therebetween. The heat generation resistor 28 is coupled to the anode electrode 23 through the contact hole H4 formed in the capacitance insulating film 95. With this configuration, heat generated in the heat generation resistor 28 is satisfactorily transmitted to the light emitting element 3 via the contact hole H4 and the anode electrode 23. The anode electrode 23 has a larger area in planar view and higher thermal conductivity than that of the heat generation resistor 28. As a result, heat generated in the heat generation resistor 28 is transmitted to the anode electrode 23 also at the overlapping part of the anode electrode 23 and the heat generation resistor 28 around the contact hole H4.

The multilayered structure of the heat generation control transistor HST is not explained herein in detail because it is the same as the multilayered structure of the drive transistor DRT illustrated in FIG. 7. The source electrode 72 (anode power supply line coupling part L1b), the drain electrode 73 (coupling wiring L6), the anode power supply line L1, and the video signal line L2 are provided in the same layer as that of the source electrode (second wiring 67) and the drain electrode 63 of the drive transistor DRT. The reset signal line L3, the initialization signal line L4, and the coupling wiring L5, which are not illustrated in FIG. 10, are also provided in the same layer as that of the anode power supply line L1 and other lines.

The heat generation control scanning line HG, the initialization control scanning line IG, and the writing control scanning line SG are provided in the same layer as that of the gate electrode 64 (first wiring 66). The light emission control scanning line BG and the reset control scanning line RG, which are not illustrated in FIG. 10, are also provided in the same layer as that of the heat generation control scanning line HG and other lines.

The semiconductor layer 71 of the heat generation control transistor HST and the semiconductor layers 76, 77, 78, and 79 of the respective transistors are provided in the same layer as that of the semiconductor layer 61 of the drive transistor DRT. The semiconductor layer 71, the source electrode 72 (anode power supply line coupling part L1b), the drain electrode 73, and the gate electrode 74 of the heat generation control transistor HST may be provided in layers different from that of the drive transistor DRT.

Figure 11:
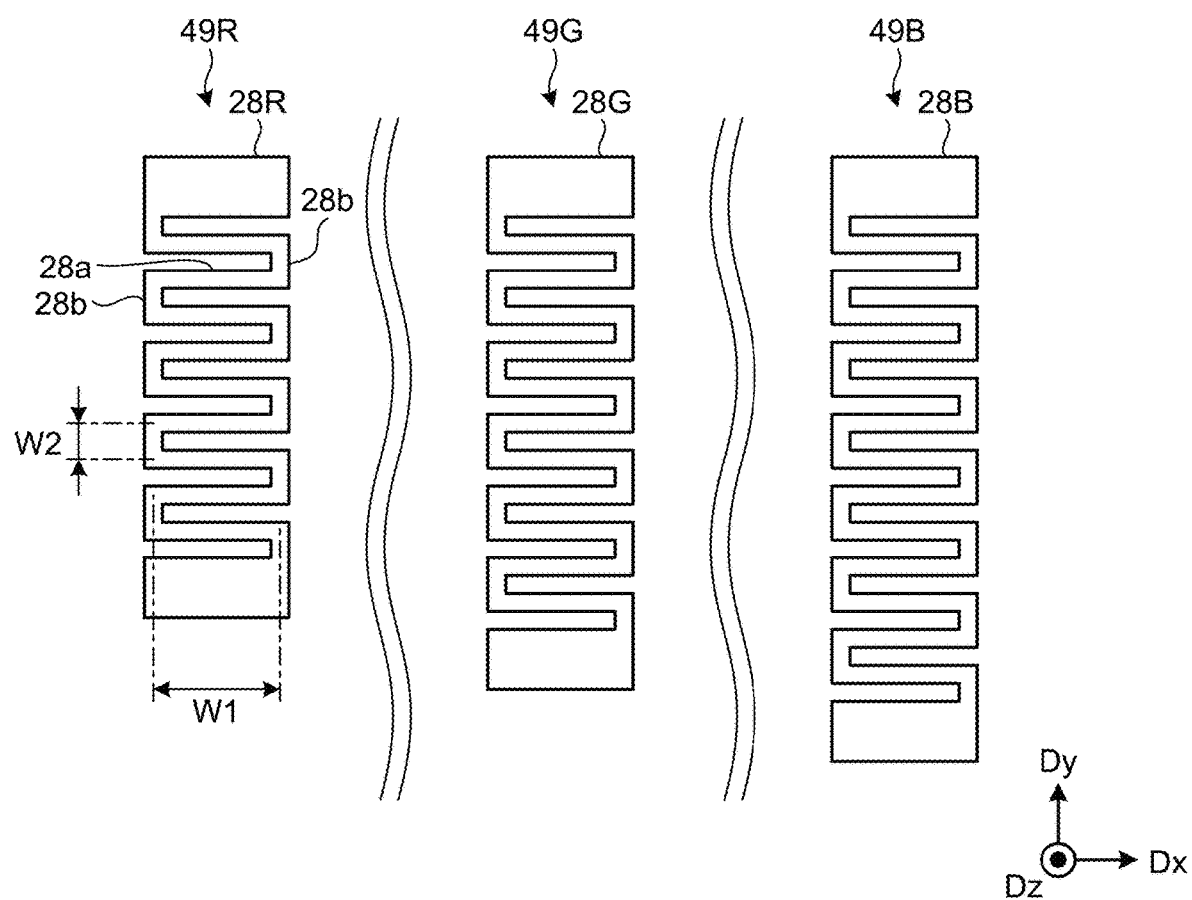
FIG. 11 is a view for explaining a first heat generation resistor included in a first sub-pixel, a second heat generation resistor included in a second sub-pixel, and a third heat generation resistor included in a third sub-pixel in comparison.

FIG. 11 is a view for explaining a first heat generation resistor included in the first sub-pixel, a second heat generation resistor included in the second sub-pixel, and a third heat generation resistor included in the third sub-pixel in comparison. As illustrated in FIG. 11, the first sub-pixel 49R includes a first heat generation resistor 28R. The second sub-pixel 49G includes a second heat generation resistor 28G. The third sub-pixel 49B includes a third heat generation resistor 28B. FIG. 11 schematically illustrates the first heat generation resistor 28R, the second heat generation resistor 28G, and the third heat generation resistor 28B in a manner disposed side by side.

The first heat generation resistor 28R, the second heat generation resistor 28G, and the third heat generation resistor 28B each include a plurality of first parts 28a and a plurality of second parts 28b. The first parts 28a extend in the first direction Dx and are arrayed in the second direction Dy. The second parts 28b each couple the ends on the same side of two first parts 28a disposed side by side in the second direction Dy. The first parts 28a and the second parts 28b are coupled to form the meander wiring pattern.

The wiring patterns of the first heat generation resistor 28R, the second heat generation resistor 28G, and the third heat generation resistor 28B have different wiring lengths. The wiring length becomes longer in order of the first heat generation resistor 28R, the second heat generation resistor 28G, and the third heat generation resistor 28B. The wiring length of the heat generation resistor 28 is the total length along the wiring pattern. In other words, the wiring length of the heat generation resistor 28 is the total length of wiring lengths W1 of the first parts 28a and wiring lengths W2 of the second parts 28b.

With this structure, the first heat generation resistor 28R, the second heat generation resistor 28G, and the third heat generation resistor 28B have different resistances. Specifically, the resistance of the first heat generation resistor 28R is lower than that of the second heat generation resistor 28G and the third heat generation resistor 28B. The resistance of the second heat generation resistor 28G is lower than that of the third heat generation resistor 28B.

As a result, the electric current flowing through the first heat generation resistor 28R is larger than that flowing through the second heat generation resistor 28G and the third heat generation resistor 28B, making the amount of generated heat in the first heat generation resistor 28R larger. If the luminous efficacy of the light emitting element 3R included in the sub-pixel 49 is lower than that of the light emitting elements 3G and 3B, the display device 1 can cause the light emitting element 3R to stably emit light by the first heat generation resistor 28R satisfactorily heating the light emitting element 3R.

While the first heat generation resistor 28R, the second heat generation resistor 28G, and the third heat generation resistor 28B have different lengths in the second direction Dy in FIG. 11, for example, they may have different resistances by other structures. The first heat generation resistor 28R, the second heat generation resistor 28G, and the third heat generation resistor 28B may have different lengths in the second direction Dy, that is, different wiring lengths W1 and W2 of the first parts 28a and the second parts 28b, for example, or different wiring widths of the first parts 28a and the second parts 28b. Alternatively, the first heat generation resistor 28R, the second heat generation resistor 28G, and the third heat generation resistor 28B may be made of different materials.

The wiring patterns of the heat generation resistors 28 illustrated in FIG. 11 are given by way of example only and may be different wiring patterns. The first heat generation resistor 28R, the second heat generation resistor 28G, and the third heat generation resistor 28B may have the same wiring pattern and the same resistance. Furthermore, all the first sub-pixel 49R, the second sub-pixel 49G, and the third sub-pixel 49B do not necessarily include the heat generation resistor 28. At least the first sub-pixel 49R may include the first heat generation resistor 28R, and at least one of the second sub-pixel 49G and the third sub-pixel 49B does not necessarily include the heat generation resistor 28.

Second Embodiment

Figure 12:
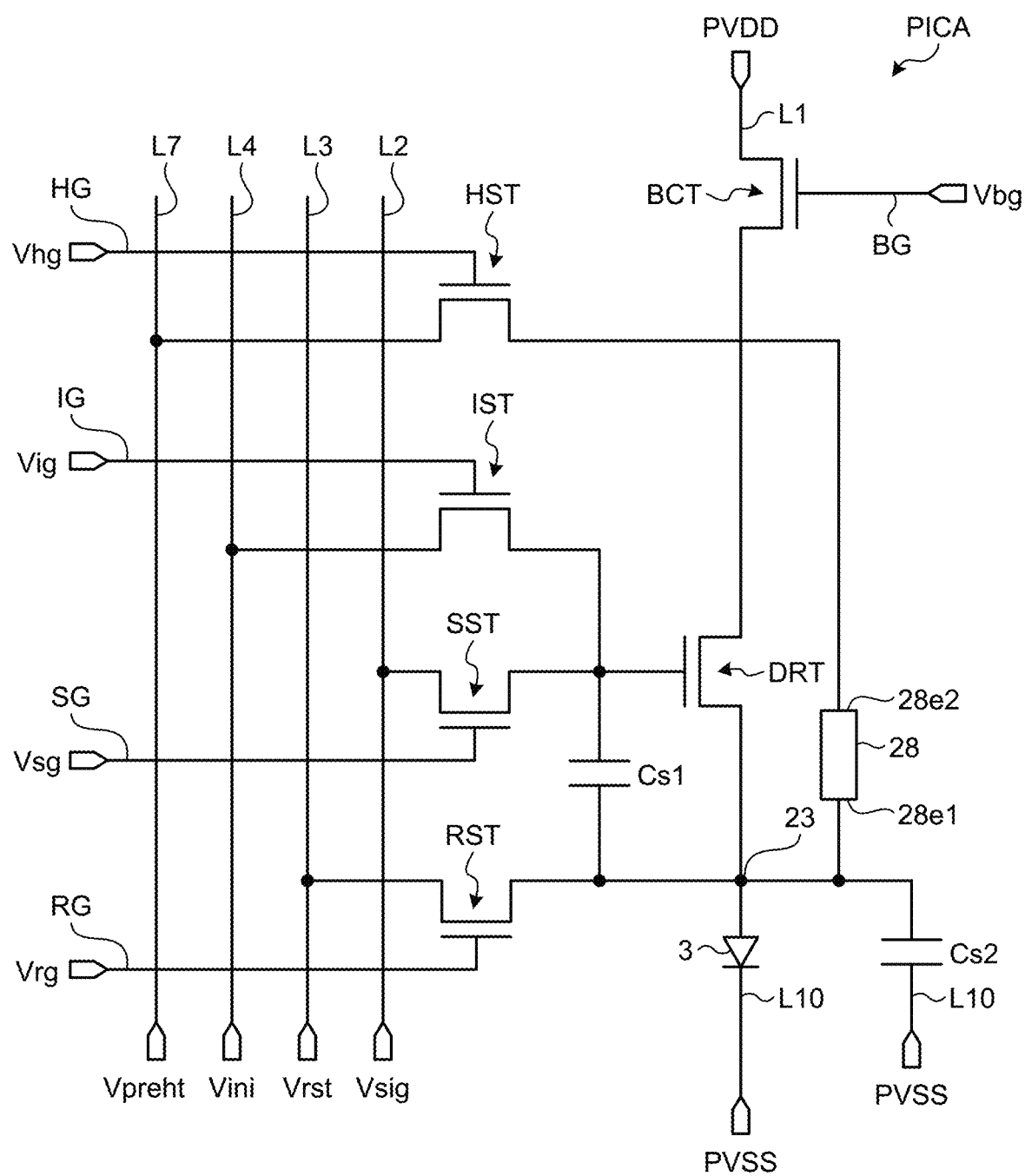
FIG. 12 is a circuit diagram of the pixel circuit according to a second embodiment.

FIG. 12 is a circuit diagram of the pixel circuit according to a second embodiment. In the following description, the same components as those described in the embodiment above are denoted by like reference numerals, and overlapping explanation thereof is omitted.

As illustrated in FIG. 12, the pixel circuit PICA according to the second embodiment is different from the first embodiment in that it includes a resistor signal line L7. The resistor signal line L7 is supplied with resistor drive signals Vpreht from the drive IC 210. The second end 28e2 of the heat generation resistor 28 is coupled to the resistor signal line L7 via the heat generation control transistor HST. The first end 28e1 of the heat generation resistor 28 is coupled to the anode electrode 23 like the first embodiment.

The operations performed by the transistors are the same as those performed in the preheating period PH illustrated in FIG. 5. The heat generation control transistor HST and the reset transistor RST are turned on, and the other transistors are turned off. As a result, the resistor signal line L7, the heat generation control transistor HST, the heat generation resistor 28, the reset transistor RST, and the reset signal line L3 are electrically coupled to form a current path. An electric current flows through the heat generation resistor 28 due to the resistor drive signals Vpreht supplied from the resistor signal line L7.

The present embodiment controls the electric potential supplied to the heat generation resistor 28 independently of the anode power supply line L1 (anode power supply potential PVDD). Consequently, the present embodiment can control heat generation in the heat generation resistor 28 in a display period of the display device 1.

Third Embodiment

Figure 13:
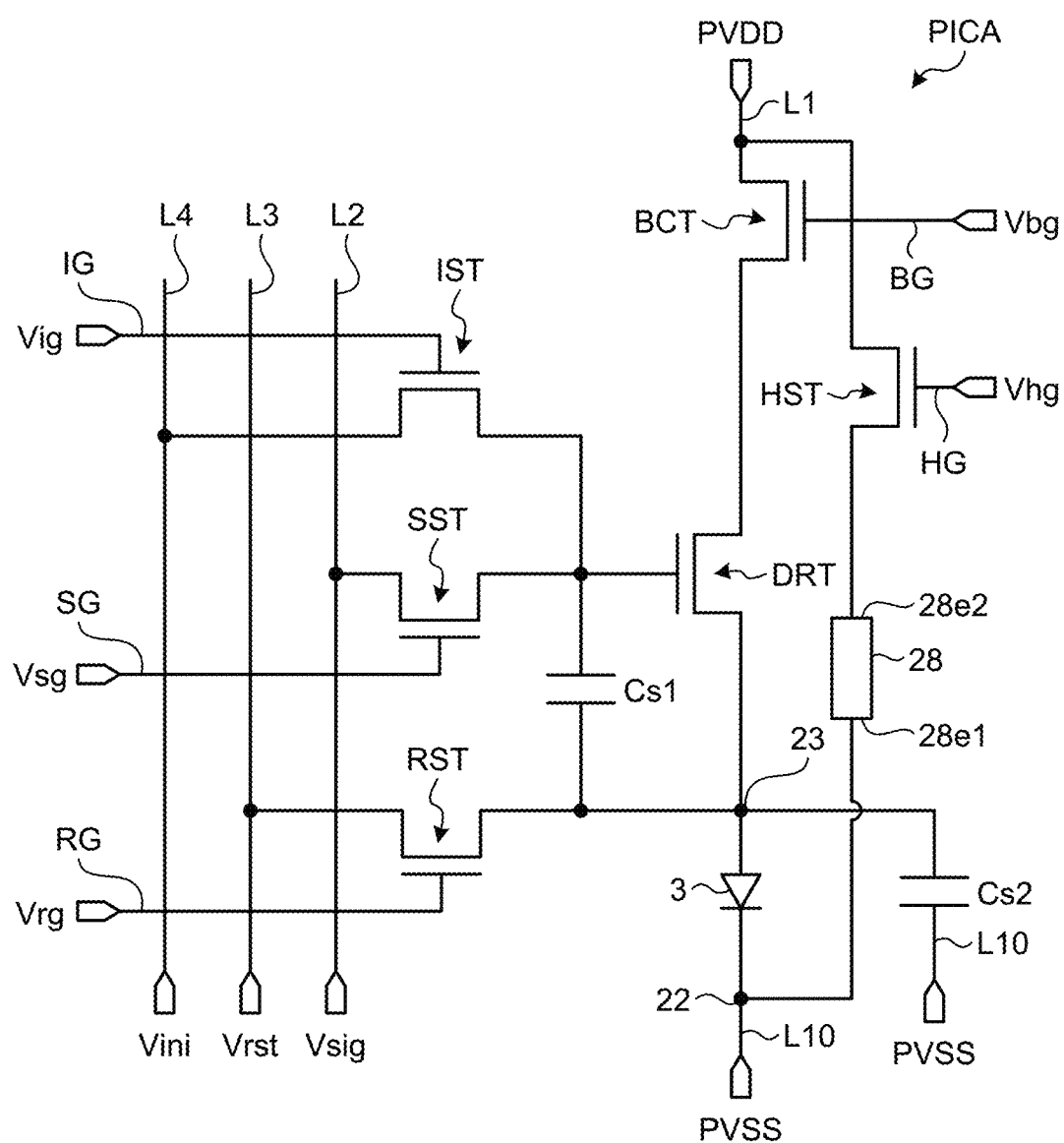
FIG. 13 is a circuit diagram of the pixel circuit according to a third embodiment.

FIG. 13 is a circuit diagram of the pixel circuit according to a third embodiment. As illustrated in FIG. 13, the pixel circuit PICA according to the third embodiment is different from the first embodiment in that the first end 28e1 of the heat generation resistor 28 is electrically coupled to the cathode electrode 22. The second end 28e2 of the heat generation resistor 28 is electrically coupled to the anode power supply line L1 via the heat generation control transistor HST like the first embodiment.

The third embodiment turns on the heat generation control transistor HST and turns off the other transistors in the preheating period PH illustrated in FIG. 5. As a result, the anode power supply line L1, the heat generation control transistor HST, the heat generation resistor 28, and the cathode power supply line L10 are electrically coupled to form a current path. An electric current flows through the heat generation resistor 28 from the anode power supply line L1 (anode power supply potential PVDD).

The third embodiment can control heat generation in the heat generation resistor 28 only by switching on and off the heat generation control transistor HST in the preheating period PH. Consequently, the third embodiment facilitates driving the pixel circuit PICA in the preheating period PH. The first end 28e1 of the heat generation resistor 28 according to the third embodiment is not coupled to the anode electrode 23. Also in this case, heat generated in the heat generation resistor 28 can be efficiently transmitted to the anode electrode 23 by employing the configuration in which part of the anode electrode 23 overlaps the heat generation resistor 28 as illustrated in FIGS. 9 and 10.

The configuration according to the present embodiment is also applicable to the second embodiment. In other words, the resistor signal line L7, the heat generation control transistor HST, the heat generation resistor 28, and the cathode power supply line L10 may be electrically coupled to form a current path in the pixel circuit PICA illustrated in FIG. 12.

Fourth Embodiment

Figure 14:
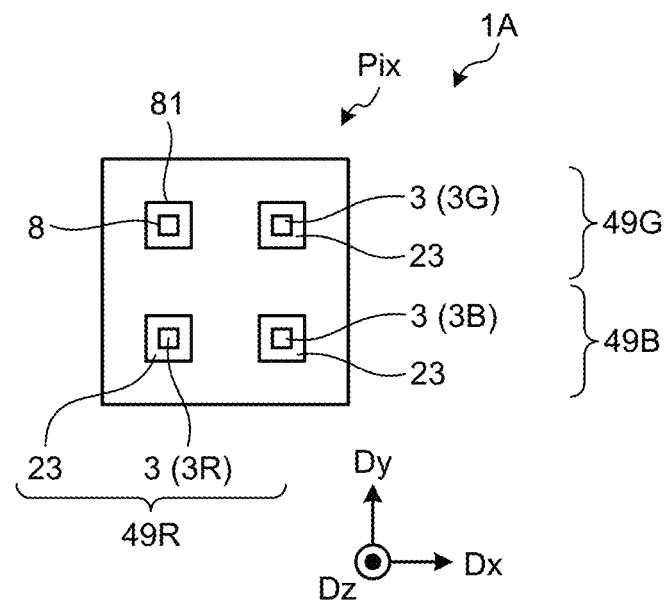
FIG. 14 is a plan view of a pixel including a temperature sensor according to a fourth embodiment.
Figure 15:
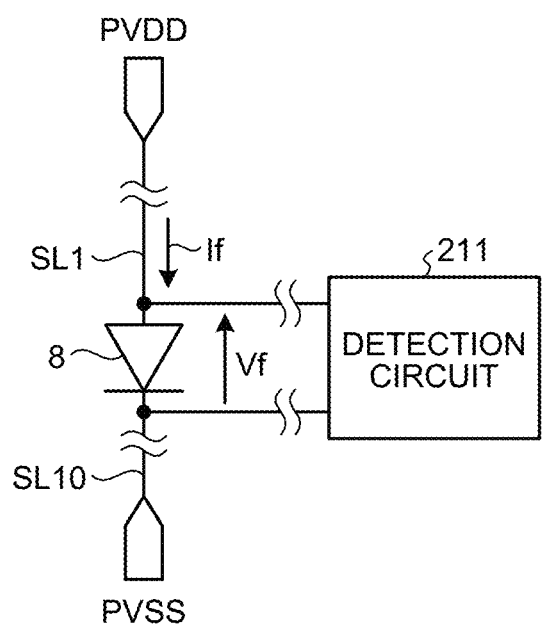
FIG. 15 is a diagram for explaining an example of the temperature sensor.

FIG. 14 is a plan view of a pixel including a temperature sensor according to a fourth embodiment. FIG. 15 is a diagram for explaining an example of the temperature sensor. As illustrated in FIG. 14, the pixel Pix of a display device 1A includes a temperature sensor 8 and a temperature sensor circuit 81. The temperature sensor 8 is a p-n junction diode, for example. The temperature sensor circuit 81 drives the temperature sensor 8. The temperature sensor circuit 81 includes circuit elements, such as a plurality of transistors, and controls supplying drive signals to the temperature sensor 8.

As illustrated in FIG. 15, the temperature sensor 8 is coupled to a sensor anode power supply line SL1 and a sensor cathode power supply line SL10 and is supplied with forward-bias voltage signals from the sensor anode power supply line SL1 and the sensor cathode power supply line SL10. The temperature sensor circuit 81 performs control such that a constant forward current If flows through the temperature sensor 8.

A detection circuit 211 receives output voltage Vf between the anode and the cathode as output signals from the temperature sensor 8. The detection circuit 211 may be provided to the drive IC 210 or as another IC different from the drive IC 210. The detection circuit 211 can detect the temperature of the pixel Pix based on the temperature dependence of the output voltage Vf of the p-n junction diode. The drive IC 210 can appropriately control the value of the electric current flowing through the heat generation resistor 28 or the ON time for turning on the heat generation control transistor HST based on the information on the temperature of the pixel Pix in the preheating period PH.

The temperature sensor circuit 81 may supply constant reverse-bias voltage signals to the temperature sensor 8. The detection circuit 211 may receive a reverse-bias current value as the output signals from the temperature sensor 8 and detect the temperature based on the temperature dependence of the reverse-bias current value. A plurality of temperature sensors 8 may be provided to the respective pixels Pix, or one temperature sensor 8 may be provided to a plurality of pixels Pix. The temperature sensor 8 may be provided to the pixel circuit PICA of each sub-pixel 49. In this case, some of the transistors provided to the pixel circuit PICA may also be used as the temperature sensor 8. Alternatively, the light emitting element 3 may also be used as the temperature sensor 8 by driving the light emitting element 3 in reverse bias.

The parts that have been described above as the anode terminal 33 and the cathode terminal 32 are not limited to those in the present specification and may be switched depending on the coupling direction of the light emitting element 3 and the application direction of the voltage. While one electrode of the light emitting element 3 is disposed at a lower part, and the other electrode is disposed at an upper part in FIGS. 7 and 8, both the electrodes may be disposed at a lower part, that is, on the side facing the array substrate 2.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display device comprising:
   a substrate;
   a plurality of pixels provided on the substrate;
   a light emitting element provided to each of the plurality of pixels;
   a first electrode provided to the substrate and electrically coupled to the light emitting element;
   a pixel circuit provided to the substrate and configured to drive the light emitting element; and
   a heat generation resistor provided to the pixel circuit;

a transistor electrically coupled to the first electrode; and a signal line configured to supply a video signal to the transistor, wherein the signal line, the heat generation resistor, and the first electrode are layered in order in the direction perpendicular to the substrate.

2. The display device according to claim 1, wherein a first end of the heat generation resistor is electrically coupled to the first electrode.

3. The display device according to claim 1, further comprising:

a second electrode provided on the substrate and electrically coupled to the light emitting element; and a second power supply line configured to supply a second potential to the light emitting element via the second electrode, wherein a first end of the heat generation resistor is electrically coupled to the second electrode.

4. The display device according to claim 1, wherein the pixel circuit comprises a first power supply line configured to supply a first potential to the light emitting element via the first electrode:, and a second end of the heat generation resistor is electrically coupled to the first power supply line.

5. The display device according to claim 2, wherein the pixel circuit comprises a resistor signal line configured to supply a resistor drive signal to the heat generation resistor, and a second end of the heat generation resistor is electrically coupled to the resistor signal line.

6. The display device according to claim 1, wherein at least a part of the first electrode overlaps the heat generation resistor in planar view seen from a direction perpendicular to the substrate.

7. The display device according to claim 3, further comprising:

an insulating film provided between a plurality of the light emitting elements and overlapping at least part of a side surfaces of the light emitting elements, wherein the second electrode is electrically coupled to the light emitting elements in a manner overlapping the light emitting elements and the insulating film.

8. The display device according to claim 1, wherein the heat generation resistor is provided in a layer different from a layer of the first electrode with an insulating film interposed therebetween and is coupled to the first electrode through a contact hole formed in the insulating film.

9. The display device according to claim 1, wherein one of the plurality of pixels includes a first sub-pixel configured to display red, a second sub-pixel configured to display green, and a third sub-pixel configured to display blue, and resistance of a first heat generation resistor included in the first sub-pixel is lower than resistance sofa. second heat generation resistor included in the second sub-pixel and resistance of a third heat generation resistor included in the third sub-pixel.

10. The display device according to claim 1, further comprising:

a temperature sensor provided to one of the plurality of pixels; and a detection circuit configured to receive an output signal from the temperature sensor and detect temperature based on temperature dependence of the output signal.

11. The display device according to claim 1, wherein the heat generation resistor has sheet resistance higher than sheet resistance of the first electrode, and the heat generation resistor has a meander wiring pattern in planar view seen from the direction perpendicular to the substrate.

* * * * *